US012745546B2

(12) United States Patent
Qi

(10) Patent No.: US 12,745,546 B2
(45) Date of Patent: Sep. 22, 2026

(54) DISPLAY PANEL AND DISPLAY DEVICE COMPRISING AN ENCAPSULATING MEMBER

(71) Applicant: WUHAN CHINA STAR OPTOELECTRONICS SEMICONDUCTOR DISPLAY TECHNOLOGY CO., LTD., Wuhan (CN)

(72) Inventor: Fei Qi, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 425 days.

(21) Appl. No.: 18/476,335

(22) Filed: Sep. 28, 2023

(65) Prior Publication Data

US 2024/0292711 A1 Aug. 29, 2024

(30) Foreign Application Priority Data

Feb. 24, 2023 (CN) ......................... 202320318014.2

(51) Int. Cl.
*H10K 59/80* (2023.01)

(52) U.S. Cl.
CPC ......... *H10K 59/873* (2023.02); *H10K 59/875* (2023.02)

(58) Field of Classification Search
CPC .. H10K 59/873; H10K 59/875; H10K 50/844; H10K 50/8445
See application file for complete search history.

(56) References Cited

U.S. PATENT DOCUMENTS 11,581,507 B2 * 2/2023 Li .......................... H10K 59/60
2016/0093828 A1 * 3/2016 Kim ................... H10K 59/8731 257/40
2020/0203663 A1 * 6/2020 Ju .......................... H10K 50/16
2023/0022371 A1 * 1/2023 He ..................... H10K 50/8445
2024/0292715 A1 * 8/2024 Qi ........................ H10K 50/858

* cited by examiner

*Primary Examiner* — Tracie Y Green
(74) *Attorney, Agent, or Firm* — PV IP PC; Christopher S. Ruprecht; Wei Te Chung

(57) ABSTRACT

A display panel includes a light-emitting device, and an encapsulating member disposed on the light-emitting device for encapsulating the light-emitting device. The encapsulating member includes a first inorganic encapsulating layer, which includes at least a first inorganic encapsulating sub-layer, a second inorganic encapsulating sub-layer, and a third inorganic encapsulating sub-layer. The thickness of the third inorganic encapsulating sub-layer is greater than that of the first inorganic encapsulating sub-layer and that of the second inorganic encapsulating sub-layer. The refractive index of the first inorganic encapsulating sub-layer is n1, the refractive index of the second inorganic encapsulating sub-layer is n2, and the refractive index of the third inorganic encapsulating sub-layer is n3, wherein n2<n3<n1, and n1−n2>0.4.

20 Claims, 3 Drawing Sheets

DISPLAY PANEL AND DISPLAY DEVICE COMPRISING AN ENCAPSULATING MEMBER

CROSS-REFERENCE TO RELATED APPLICATION

The present disclosure claims priority to and the benefit of Chinese Patent Application No. 202320318014.2, filed on Feb. 24, 2023, the disclosure of which is incorporated herein by reference in its entirety.

TECHNICAL FIELD

The present disclosure relates to the field of display technology, and more particularly, to a display panel and a display device.

BACKGROUND

For organic light-emitting diode (OLED) products, in order to ensure that the encapsulating member for encapsulating a light-emitting device has a higher transmittance, the inorganic encapsulating sub-layer in a first inorganic encapsulating layer of the encapsulating member that is closest to the light-emitting device and plays a regulating role has a low refractive index, since an inorganic film with a lower refractive index generally has higher oxygen content, the inorganic encapsulating sub-layer to have poor water-oxygen barrier ability, and water and oxygen directly enters and passes through the inorganic encapsulating sub-layer with weak water-oxygen barrier ability through the side of the screen body, which easily leads to encapsulating failure.

Therefore, it is urgent to provide a display panel and a display device to solve the above technical problems.

SUMMARY

The embodiments of the present disclosure provide a display panel and a display device, so as to solve the technical problem that an inorganic encapsulating sub-layer of a first inorganic encapsulating layer of an existing display panel and an encapsulating member of the display device has a poor water-oxygen barrier ability, which easily leads to encapsulating failure.

In order to solve the above problems, the technical solutions provided by the present disclosure are as follows.

The present disclosure provides a display panel including:

- a light-emitting device; and
- an encapsulating member disposed on the light-emitting device for encapsulating the light-emitting device, wherein the encapsulating member includes a first inorganic encapsulating layer, the first inorganic encapsulating layer includes at least a first inorganic encapsulating sub-layer, a second inorganic encapsulating sub-layer, and a third inorganic encapsulating sub-layer that are sequentially stacked in a direction away from the light-emitting device.

A thickness of the third inorganic encapsulating sub-layer is greater than a thickness of the first inorganic encapsulating sub-layer and a thickness of the second inorganic encapsulating sub-layer; a refractive index of the first inorganic encapsulating sub-layer is n1, a refractive index of the second inorganic encapsulating sub-layer is n2, and a refractive index of the third inorganic encapsulating sub-layer is n3, wherein $n2<n3<n1$, and $n1-n2>0.4$.

According to the display panel provided by the present disclosure, $n1>1.9$.

According to the display panel provided by the present disclosure, $n3>1.7$.

According to the display panel provided by the present disclosure, $n2<1.5$.

According to the display panel provided by the present disclosure, the light-emitting device includes a first electrode, a second electrode, and a light-emitting layer disposed between the first electrode and the second electrode, and the second electrode is disposed on one side of the light-emitting layer close to the encapsulating member.

The display panel further includes an organic light-gathering layer disposed between the first inorganic encapsulating sub-layer and the second electrode.

According to the display panel provided by the present disclosure, a side surface of the first inorganic encapsulating sub-layer close to the light-emitting device is in contact with a side surface of the light-emitting device close to the encapsulating member.

According to the display panel provided by the present disclosure, a material of the first inorganic encapsulating sub-layer includes silicon nitride and materials of the second inorganic encapsulating sub-layer and the third inorganic encapsulating sub-layer includes silicon oxynitride.

According to the display panel provided by the present disclosure, the first inorganic encapsulating layer further includes a fourth inorganic encapsulating sub-layer disposed on one side of the third inorganic encapsulating sub-layer away from the light-emitting device; and wherein a thickness of the fourth inorganic encapsulating sub-layer is less than the thickness of the third inorganic encapsulating sub-layer, and a refractive index of the fourth inorganic encapsulating sub-layer is n4, $n4<n3$.

According to the display panel provided by the present disclosure, the display panel further includes an organic encapsulating layer disposed on one side of the first inorganic encapsulating layer away from the light-emitting device and a second inorganic encapsulating layer disposed on one side of the organic encapsulating layer away from the light-emitting device.

The present disclosure provides a display device including the above display panels.

The beneficial effects of the present disclosure are as follows: According to the display panel and the display device provided in the present disclosure, the first inorganic encapsulating layer of the encapsulating member includes at least a first inorganic encapsulating sub-layer, a second inorganic encapsulating sub-layer, and a third inorganic encapsulating sub-layer that are sequentially stacked in a direction away from the light-emitting device. Compared with the related arts, in which only one inorganic encapsulating sub-layer (namely, the second inorganic encapsulating sub-layer) that plays a regulating role is disposed on the side of the third inorganic encapsulating sub-layer close to the light-emitting device, and the third inorganic encapsulating sub-layer plays the main encapsulating role; in the present disclosure, a first inorganic encapsulating sub-layer is added on the side of the second inorganic encapsulating sub-layer close to the light-emitting device. The thickness of the third inorganic encapsulating sub-layer is greater than that of the first inorganic encapsulating sub-layer and that of the second inorganic encapsulating sub-layer. Further, the refractive indices of the first inorganic encapsulating sub-layer, the second inorganic encapsulating sub-layer and the third inorganic encapsulating sub-layer are controlled, so that the refractive indices of the first inorganic encapsulating sub-layer, the second inorganic encapsulating sub-layer and the third inorganic encapsulating sub-layer satisfies n2<n3<n1 and n1−n2>0.4. Since the first inorganic encapsulating sub-layer has a high refractive index, it is beneficial to improve the water-oxygen barrier ability of the first inorganic encapsulating layer without affecting the light-emitting rate of the light-emitting device, thereby improving the encapsulating performance of the encapsulating member.

BRIEF DESCRIPTION OF THE DRAWINGS

In order to more clearly describe the technical solutions in the embodiments of the present disclosure, hereinafter, the appended drawings used for describing the specific embodiments will be briefly introduced. Apparently, the appended drawings described below are only directed to some embodiments of the present disclosure, and for a person skilled in the art, without expenditure of creative labor, other drawings can be derived on the basis of these appended drawings.

LIST OF REFERENCE SIGNS

Figure 1:
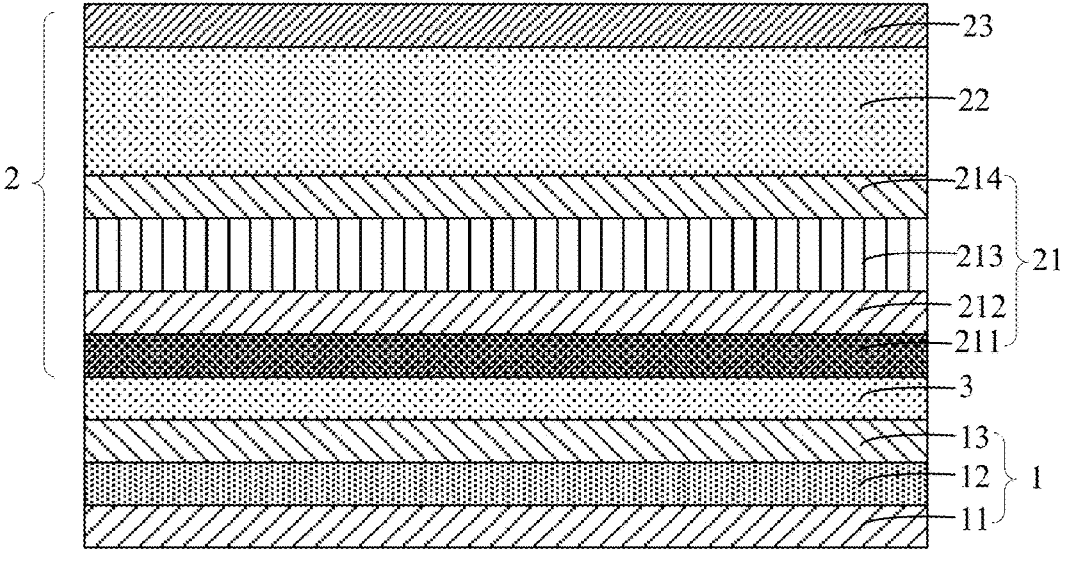
FIG. 1 is a schematic diagram of a cross-sectional configuration of a display panel according to some embodiments of the present disclosure.

1: Light-emitting device; 11: first electrode; 12: light-emitting layer; 13: second electrode; 2: encapsulating member; 21: first inorganic encapsulating layer; 211. first inorganic encapsulating sub-layer; 212. second inorganic encapsulating sub-layer; 213. third inorganic encapsulating sub-layer; 214. fourth inorganic encapsulating sub-layer; 22. second inorganic encapsulating layer; 23. organic encapsulating layer; 3. organic light-gathering layer.

DETAILED DESCRIPTION

Hereinafter, technical solution in embodiments of the present disclosure will be clearly and completely described with reference to the accompanying drawings in embodiments of the present disclosure. Obviously, the described embodiments are part of, but not all of, the embodiments of the present disclosure. All the other embodiments, obtained by a person with ordinary skill in the art on the basis of the embodiments in the present disclosure without expenditure of creative labor, belong to the protection scope of the present disclosure. In addition, it should be understood that specific embodiments described herein are only used to illustrate and explain the present disclosure, and are not intended to limit the present disclosure. In the present disclosure, unless otherwise stated, orientation words such as "up" and "down" generally refers to "up" and "down" in the actual use or working state of a device, and exemplarily refers to the drawing direction in the drawings; while "inside" and "outside" refer to outline of a device.

Referring to FIG. 1, which is a schematic diagram of a cross-sectional configuration of a display panel according to some embodiments of the present disclosure. Embodiments of the present disclosure provide a display panel, which may include one of an organic light-emitting diode display panel and a quantum dot light-emitting diode.

The display panel includes a light-emitting device 1 and an encapsulating member 2. The encapsulating member 2 is disposed on the light-emitting device 1 for encapsulating the light-emitting device 1. The light-emitting device 1 includes a plurality of light-emitting pixels for emitting light, and the plurality of light-emitting pixels may include red light-emitting pixels, green light-emitting pixels, blue light-emitting pixels, and white light-emitting pixels. The encapsulating member 2 covers the plurality of light-emitting pixels to prevent external water and oxygen from invading the plurality of light-emitting pixels, thereby avoiding failure of the organic light-emitting material in the light-emitting pixels and causing poor display.

The display panel further includes a driving device (not shown in the figure), which is located on one side of the light-emitting device 1 away from the encapsulating member 2. The driving device includes a plurality of driving circuits corresponding to and electrically connected to the plurality of light-emitting pixels for driving the plurality of light-emitting pixels to realize light emitting and displaying. The driving circuits include a plurality of thin film transistors, which may include driving thin film transistors for controlling the light-emitting pixels and switching thin film transistors for switching the driving thin film transistors. A thin film transistor may include a semiconductor layer, a gate, a source, and a drain, wherein the semiconductor layer may be formed of an inorganic semiconductor or an organic semiconductor. A driving device further includes an insulating film layer such as a gate insulating layer, an interlayer dielectric layer, a passivation layer, and a planarization layer. As related arts, details are not described herein.

The encapsulating member 2 may adopt a film encapsulating mode. The encapsulating member 2 may adopt an inorganic encapsulating stack or an inorganic-organic-inorganic multi-layer encapsulating stack. In the embodiments of the present disclosure, the encapsulating member 2 includes a first inorganic encapsulating layer 21, and the first inorganic encapsulating layer 21 includes at least a first inorganic encapsulating sub-layer 211, a second inorganic encapsulating sub-layer 212, and a third inorganic encapsulating sub-layer 213 that are sequentially stacked in a direction away from the light-emitting device 1. The thickness of the third inorganic encapsulating sub-layer 213 is greater than the thickness of the first inorganic encapsulating sub-layer 211 and the thickness of the second inorganic encapsulating sub-layer 212. The refractive index of the first inorganic encapsulating sub-layer 211 is n1, the refractive index of the second inorganic encapsulating sub-layer 212 is n2, and the refractive index of the third inorganic encapsulating sub-layer 213 is n3, wherein n2<n3<n1.

The design logic of the technical solutions provided by the present disclosure is described as follows:

It will be appreciated that the third inorganic encapsulating sub-layer 213 is the encapsulating sub-layer that plays the main encapsulating role in the first inorganic encapsulating layer 21. The second inorganic encapsulating sub-layer 212 is the encapsulating sub-layer that plays a regulating role in the first inorganic encapsulating layer 21. In order to ensure that the encapsulating member 2 for encapsulating a light-emitting device has a higher transmittance, the refractive index n2 of the second inorganic encapsulating sub-layer 212 is generally much lower than the refractive index n3 of the third inorganic encapsulating sub-layer 213. However, since the inorganic film with a lower refractive index generally has higher oxygen content, the second inorganic encapsulating sub-layer 212 has poor water-oxygen barrier ability, so that encapsulating performance of the encapsulating member cannot be guaranteed.

In view of this, in the present disclosure, the first inorganic encapsulating sub-layer 211 is added on the second inorganic encapsulating sub-layer 212 close to the light-emitting device 1. Further, the refractive index n1 of the first inorganic encapsulating sub-layer 211 is controlled to be greater than the refractive index n2 of the second inorganic encapsulating sub-layer 212 and the refractive index n3 of the third inorganic encapsulating sub-layer 213, that is, n2<n3<n1. That is to say, the new added first inorganic encapsulating sub-layer 211 has a high refractive index and has a good water-oxygen barrier ability, so that the encapsulating performance of the encapsulating member 2 can be improved.

However, at the same time, the first inorganic encapsulating sub-layer 211 has a high refractive index. In order to avoid deterioration of light-emitting efficiency of the light-emitting device 1, in the embodiments of the present disclosure, the relationship of the refractive index n1 of the first inorganic encapsulating sub-layer 211 and the refractive index n2 of the second inorganic encapsulating sub-layer 212 is controlled to satisfy n1−n2>0.4, so as to ensure the light-emitting efficiency of the light-emitting device 1.

In the embodiments of the present disclosure, the thickness of the third inorganic encapsulating sub-layer 213 is greater than the thickness of the first inorganic encapsulating sub-layer 211 and the thickness of the second inorganic encapsulating sub-layer 212. The reason for this arrangement is to ensure the barrier ability. The third inorganic encapsulating sub-layer 213 has a greater thickness, and the thickness of the third inorganic encapsulating sub-layer 213 is larger than 500 nanometers. For example, the thickness of the first inorganic encapsulating sub-layer 211 may be one of 510 nanometers, 520 nanometers, 550 nanometers, and 600 nanometers. The second inorganic encapsulating sub-layer 212 is a regulating layer and does not need to be too thick. The thickness of the second inorganic encapsulating sub-layer 212 ranges from 10 nm to 200 nm. For example, the thickness of the second inorganic encapsulating sub-layer 212 may be one of 10 nm, 50 nm, 100 nm, 150 nm, and 200 nm. The thickness of the first inorganic encapsulating sub-layer 211 ranges from 10 nm to 200 nm.

Figure 2:
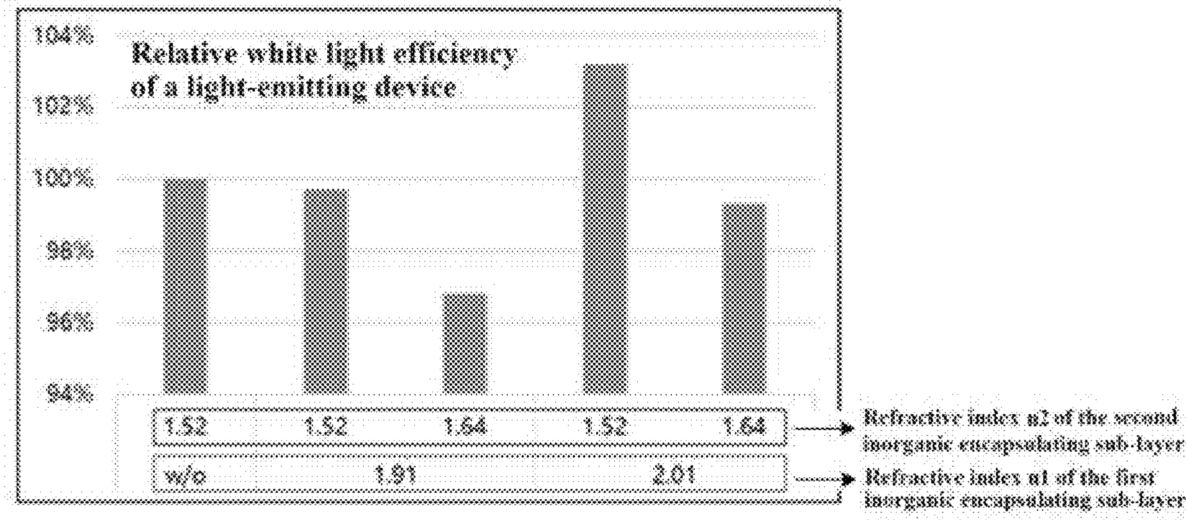
FIG. 2 is a schematic diagram showing a relationship between the relative white light efficiency of a light-emitting device and the refractive index of a first inorganic encapsulating sub-layer and the refractive index of a second inorganic encapsulating sub-layer according to some embodiments of the present disclosure.

Referring to FIG. 2, which is a schematic diagram showing a relationship between a relative white light efficiency of a light-emitting device and a refractive index of a first inorganic encapsulating sub-layer 211 and a refractive index of a second inorganic encapsulating sub-layer 212 according to some embodiments of the present disclosure. In the present disclosure, the first inorganic encapsulating sub-layer 211 and the second inorganic encapsulating sub-layer 212 with different refractive indices are combined to test the relative white light efficiency of the light-emitting device 1. As can be seen from FIG. 2, in the case that the refractive index n2 of the second inorganic encapsulating 212 is 1.52:

Firstly, in the case that the first inorganic encapsulating sub-layer 211 is not provided, the relative white light efficiency of the light-emitting device 1 is 100%.

In the case that the first inorganic encapsulating sub-layer 211 is provided, and the refractive index n1 of the first inorganic encapsulating sub-layer 211 is 1.91, that is, when the difference between the refractive index n1 of the first inorganic encapsulating sub-layer 211 and the refractive index n2 of the second inorganic encapsulating sub-layer 212 is 0.39, the relative white light efficiency of the light-emitting device 1 is less than 100%, which is slightly decreased. In the case that the first inorganic encapsulating sub-layer 211 is provided, and the refractive index n1 of the first inorganic encapsulating sub-layer 211 is 2.01, that is, when the difference between the refractive index n1 of the first inorganic encapsulating sub-layer 211 and the refractive index n2 of the second inorganic encapsulating sub-layer 212 is 0.49, the relative white light efficiency of the light-emitting device 1 is greater than 100%, which is significantly improved.

Next, in the case that the refractive index n2 of the second inorganic encapsulating sub-layer 212 is 1.64:

In the case that the first inorganic encapsulating sub-layer 211 is provided, and the refractive index n1 of the first inorganic encapsulating sub-layer 211 is 1.91, that is, when the difference between the refractive index n1 of the first inorganic encapsulating sub-layer 211 and the refractive index n2 of the second inorganic encapsulating sub-layer 212 is 0.2, the relative white light efficiency of the light-emitting device 1 is less than the white light efficiency of the second inorganic encapsulating sub-layer 1 in the case that the refractive index n2 of the second inorganic encapsulating sub-layer 211 is 1.52, which is less than 98%, and it is significantly decreased.

In the case that the first inorganic encapsulating sub-layer 211 is provided, and the refractive index n1 of the first inorganic encapsulating sub-layer 211 is 2.01, that is, when the difference between the refractive index n1 of the first inorganic encapsulating sub-layer 211 and the refractive index n2 of the second inorganic encapsulating sub-layer 212 is 0.37, the relative white light efficiency of the light-emitting device 1 is less than the white light efficiency of the second inorganic encapsulating sub-layer 1 in the case that the refractive index n2 of the second inorganic encapsulating sub-layer is 1.52, which is less than 100%, and it is slightly decreased.

Understandably, the analysis shows that when n1−n2<0.4, the relative white light efficiency of the light-emitting device 1 is less than 100%, the relative white light efficiency decreases, and when n1−n2>0.4, the relative white light efficiency of the light-emitting device 1 is greater than 100%, the relative white light efficiency increases. Therefore, in the present disclosure, n1−n2>0.4 is controlled to ensure the relative white light efficiency of the light-emitting device 1, which is beneficial to improving the display effect of the display panel.

Further, referring to Table 1 below, the difference between the refractive index n1 of the first inorganic encapsulating sub-layer 211 and the refractive index n3 of the third inorganic encapsulating sub-layer 213 and the encapsulating performance of the encapsulating member 2 can be seen. In the present disclosure, the first inorganic encapsulating sub-layer 211 and the third inorganic encapsulating sub-layer 213 with different refractive indices are combined to perform a WHTS measurement test on the light-emitting device 1. It should be noted that the WHTS measurement test is a storage test under high temperature and high humidity conditions, which means that the display panel is placed in an oven at a temperature of about 85° C. and a humidity of about 85% for several hours to qualitatively evaluate whether dark spots and the like appear. The relationship between the light-emitting device 1 passing the test and the refractive index n1 of the first inorganic encapsulating sub-layer 211 and the refractive index n3 of the third inorganic encapsulating sub-layer 213 is shown in Table 1 below, and are described below in detail:

In the case that the first inorganic encapsulating sub-layer 211 is not provided, and the refractive index n3 of the third inorganic encapsulating sub-layer 213 is 1.81, the display panel passes the 120 h storage test and the 240 h storage test, but fails to pass the 360 h storage test.

In the case that the refractive index n1 of the first inorganic encapsulating sub-layer 211 is 1.91, and the refractive index n3 of the third inorganic encapsulating sub-layer 213 is 1.81, the display panel passes the 120 h storage test and the 240 h storage test, but fails to pass the 360 h storage test.

In the case that the refractive index n1 of the first inorganic encapsulating sub-layer 211 is 2.01, and the refractive index n3 of the third inorganic encapsulating sub-layer 213 is 1.81, the display panel passes the 120 h storage test, the 240 h storage test, and the 360 h storage test.

In the case that the refractive index n1 of the first inorganic encapsulating sub-layer 211 is 2.01, and the refractive index n3 of the third inorganic encapsulating sub-layer 213 is 1.7, the display panel only passes the 120 h storage test, but In the case that pass the 240 h storage test and the 360 h storage test.

It should be noted that "w/o" in Table 1 indicates that the display panel is not provided with the first inorganic encapsulating sub-layer 211, "NG" indicates that the display panel fails to pass the storage test of a corresponding time, and "PASS" means that the display panel passes the storage test of a corresponding time, wherein the longer the display panel passes the storage test, the better the encapsulating performance of the sealing member is.

It can be seen that, with the increase of the refractive index n1 of the first inorganic encapsulating sub-layer 211 increases, the display panel can pass the storage test for a longer time. Therefore, in order to ensure the encapsulating performance of the encapsulating member 2 and the reliability of the display panel, in the embodiments of the present disclosure, the refractive index of the first inorganic encapsulating sub-layer 211 is controlled to satisfy the following relationship: n1>1.9.

Further, with the increase of the refractive index n3 of the third inorganic encapsulating sub-layer 213 increases, the display panel can pass the storage test for a longer time. Therefore, in order to ensure the encapsulating performance of the encapsulating member 2 and the reliability of the display panel, in the embodiments of the present disclosure, the refractive index of the third inorganic encapsulating sub-layer 213 is controlled to satisfy the following relationship: N3>1.7.

TABLE 1

| | | 85° C., 85 RH | | |
|---|---|---|---|---|
| n1 | n3 | 120 h | 240 h | 360 h |
| w/o | 1.81 | PASS | PASS | NG |
| 1.91 | 1.81 | PASS | PASS | NG |
| 2.01 | 1.81 | PASS | PASS | PASS |
| 2.01 | 1.7 | PASS | NG | |

In some embodiments, the refractive index n2 of the second inorganic encapsulating sub-layer 212 needs to be determined according to the values of the refractive index n1 of the first inorganic encapsulating sub-layer 211 and the refractive index n3 of the third inorganic encapsulating sub-layer 213. Exemplarily, the refractive index n2 of the second inorganic encapsulating sub-layer 212 satisfies the following relationship: n2<1.5.

Exemplarily, the light-emitting device 1 includes a first electrode 11, a second electrode 13, and a light-emitting layer 12 disposed between the first electrode 11 and the second electrode 13. The second electrode 13 is disposed on one side of the light-emitting layer 12 close to the encapsulating member 2. The first electrode 11 may be one of an anode or a cathode, and the second electrode 13 is another of an anode or a cathode. In the embodiments of the present disclosure, the display panel is a top-emitting display panel, the first electrode 11 is an anode, and the second electrode 13 is a cathode. The first electrode 11 may include Ag, Mg, Al, Pt, Pd, Au, Ni, Nd, Ir, Cr, or a mixture of these metals. The second electrode 13 may include a transparent metal oxide such as indium tin oxide (ITO), indium zinc oxide (IZO), zinc oxide (ZnO), and indium tin zinc oxide (ITZO). Of course, the light-emitting device 1 further includes a pixel definition layer which defines a plurality of pixel openings, the pixel openings expose the anode, and the light-emitting layer 12 is disposed in the pixel openings.

In some embodiments, continuing to refer to FIG. 1, the display panel further includes an organic light-gathering layer 3 (CPL) disposed between the first inorganic encapsulating sub-layer 211 and the second electrode 13. The organic light-gathering layer 3 has a high refractive index, and light emitted from the light-emitting device 1 is converged after passing through the organic light-gathering layer 3, so that the light-gathering purpose is achieved by reducing the light emission angle.

Figure 3:
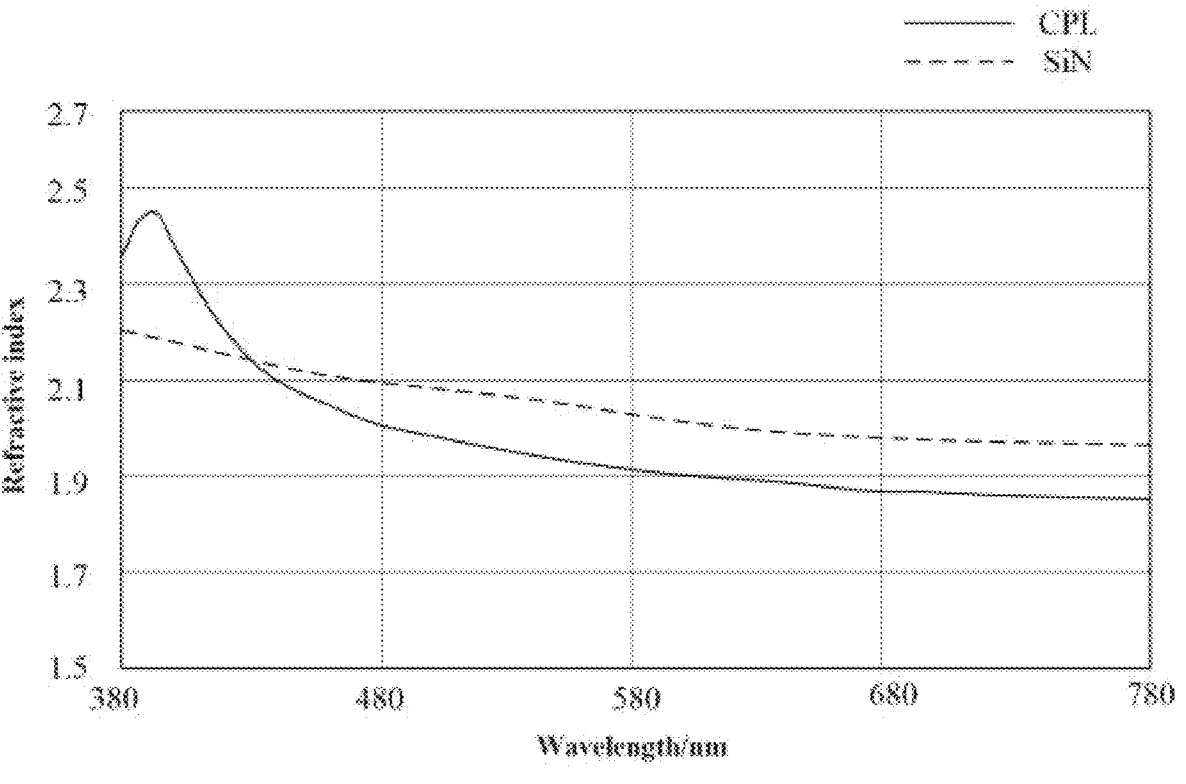
FIG. 3 is a schematic diagram showing a relationship between the refractive index of an organic light-gathering layer and the refractive index of a first inorganic encapsulating sub-layer and a wavelength according to some embodiments of the present disclosure.

Understandably, please refer to FIG. 3, which is a schematic diagram showing a relationship between a refractive index of an organic light-gathering layer and a refractive index n1 of a first inorganic encapsulating sub-layer and a wavelength according to some embodiments of the present disclosure. Since the light-emitting device 1 emits light of different colors, the material of the organic light-gathering layer 3 needs to have a high refractive index for each color (e.g., RGB) band. However, the refractive index of the materials commonly used in the organic light-gathering layer 3 decreases significantly with the increase of wavelength, which leads to the relatively weak red light-gathering ability of the organic light-gathering layer 3. In the embodiments of the present disclosure, the material of the first inorganic encapsulating sub-layer 211 includes silicon nitride. Since the silicon nitride can have a relatively high refractive index through manufacturing processes, and with the increase of wavelength, the decrease trend of the refractive index of the silicon nitride is relatively gentle and the change is relatively small, which makes it easier to maintain a relatively high refractive index in the entire wavelength band. Therefore, it is beneficial to improving the light-gathering ability of the light emitted from the light-emitting device 1.

Figure 4:
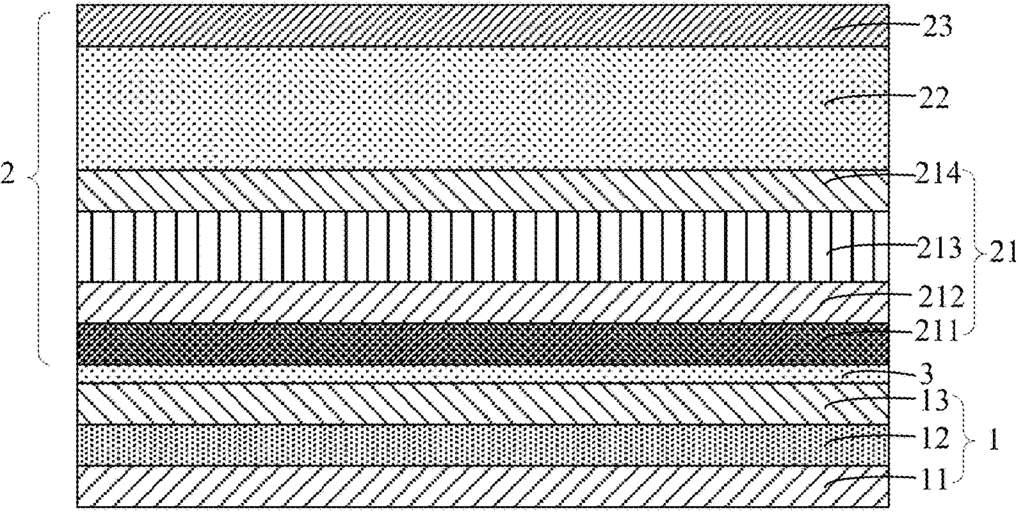
FIG. 4 is a schematic diagram of a cross-sectional configuration of another display panel according to some embodiments of the present disclosure.

Since the first inorganic encapsulating sub-layer 211 can the same role as the organic light-gathering layer, in one embodiment, the first inorganic encapsulating sub-layer 211 and the organic light-gathering layer 3 exist at the same time. In this case, as shown in FIG. 4, which is a schematic diagram of a cross-sectional configuration of another display panel according to some embodiments of the present disclosure. FIG. 4 differs from FIG. 1 in that the first inorganic encapsulating sub-layer 211 may partially replace the organic light-gathering layer 3, i.e., the thickness of the organic light-gathering layer 3 may be reduced.

Figure 5:
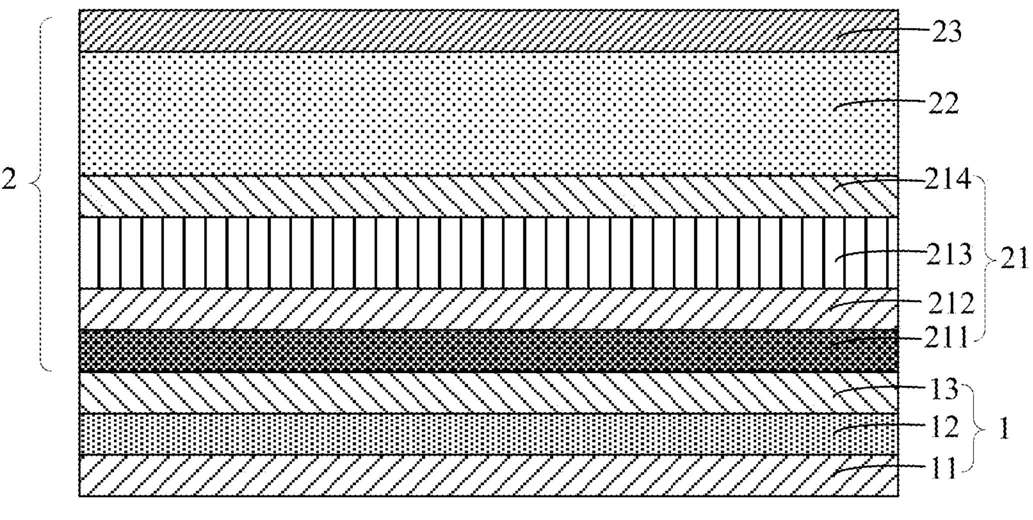
FIG. 5 is a schematic diagram of a cross-sectional configuration of further another display panel according to some embodiments of the present disclosure.

In another embodiment, referring to FIG. 5, which is a schematic diagram of a cross-sectional configuration of further another display panel according to some embodiments of the present disclosure. FIG. 5 differs from FIG. 1 in that the first inorganic encapsulating sub-layer 211 can completely replace the organic light-gathering layer 3, that is, the arrangement of the organic light-gathering layer 3 can be eliminated, and one side surface of the first inorganic encapsulating sub-layer 211 close to the light-emitting device 1 is in contact with one side surface of the light-emitting device 1 close to the light-emitting device 1, that is, the first inorganic encapsulating sub-layer 211 is directly disposed on one side surface of the second electrode 13 away from the light-emitting device 1.

In some embodiments, the materials of the first inorganic encapsulating sub-layer 211 and the second inorganic encapsulating sub-layer 212 include silicon oxynitride.

In some embodiments, the first inorganic encapsulating layer 21 further includes a fourth inorganic encapsulating sub-layer 214 disposed on one side of the third inorganic encapsulating sub-layer 213 away from the light-emitting device 1. The thickness of the fourth inorganic encapsulating sub-layer 214 is less than the thickness of the third inorganic encapsulating sub-layer 213. The refractive index of the fourth inorganic encapsulating sub-layer 214 is n4, $n4<n3$.

In some embodiments, the display panel further includes an organic encapsulating layer 23 disposed on one side of the first inorganic encapsulating layer 21 away from the light-emitting device 1, and a second inorganic encapsulating layer 22 disposed on one side of the organic encapsulating layer 23 away from the light-emitting device 1. The organic encapsulating layer 23 may include an organic material, for example, acrylic resin, epoxy resin, polyimide, and polyethylene, but is not limited thereto.

Of course, in other embodiments, in order to obtain better encapsulating performance, the display panel may further include more organic encapsulating layers and inorganic encapsulating layers disposed on the side of the second inorganic encapsulating layer 22 away from the light-emitting device 1, and the present disclosure is not limited thereto.

The embodiments of the present disclosure further provide a display device including the display panel in the above-described embodiments. The display device may include a movable display device (such as a notebook computer, a mobile phone, and the like), a fixed terminal (such as a desktop computer, a television, and the like), a measuring device (such as a sports bracelet, a thermometer, and the like), and the like.

The present disclosure provides a display panel and a display device. According to the display panel and the display device provided in the present disclosure, the first inorganic encapsulating layer of the encapsulating member includes at least a first inorganic encapsulating sub-layer, a second inorganic encapsulating sub-layer, and a third inorganic encapsulating sub-layer that are sequentially stacked in a direction away from the light-emitting device. Compared with the related arts, in which only one inorganic encapsulating sub-layer (namely, the second inorganic encapsulating sub-layer) that plays a regulating role is disposed on the side of the third inorganic encapsulating sub-layer close to the light-emitting device, and the third inorganic encapsulating sub-layer plays the main encapsulating role; in the present disclosure, a first inorganic encapsulating sub-layer is added on the side of the second inorganic encapsulating sub-layer close to the light-emitting device. The thickness of the third inorganic encapsulating sub-layer is greater than that of the first inorganic encapsulating sub-layer and that of the second inorganic encapsulating sub-layer. Further, the refractive indices of the first inorganic encapsulating sub-layer, the second inorganic encapsulating sub-layer and the third inorganic encapsulating sub-layer are controlled, so that the refractive indices of the first inorganic encapsulating sub-layer, the second inorganic encapsulating sub-layer and the third inorganic encapsulating sub-layer satisfies $n2<n3<n1$ and $n1-n2>0.4$. Since the first inorganic encapsulating sub-layer has a high refractive index, it is beneficial to improve the water-oxygen barrier ability of the first inorganic encapsulating layer without affecting the light-emitting rate of the light-emitting device, thereby improving the encapsulating performance of the encapsulating member.

In view of above, although the present disclosure has been disclosed above in terms of preferred embodiments, the above preferred embodiments are not intended to limit the present disclosure. Those skilled in the art may make can make various changes and modifications without departing from the spirit and scope of the present disclosure, so the scope of protection of the present disclosure shall be subject to the scope defined by the claims.

What is claimed is:

1. A display panel, comprising:

a light-emitting device; and an encapsulating member disposed on the light-emitting device for encapsulating the light-emitting device, the encapsulating member comprising a first inorganic encapsulating layer, a second inorganic encapsulating layer, and an organic encapsulating layer stacked sequentially, the first inorganic encapsulating layer comprising at least a first inorganic encapsulating sub-layer, a second inorganic encapsulating sub-layer, a third inorganic encapsulating sub-layer, and a fourth inorganic encapsulating sub-layer that are sequentially stacked in a direction away from the light-emitting device;

wherein a thickness of the third inorganic encapsulating sub-layer is greater than a thickness of the first inorganic encapsulating sub-layer and a thickness of the second inorganic encapsulating sub-layer; a refractive index of the first inorganic encapsulating sub-layer is n1, a refractive index of the second inorganic encapsulating sub-layer is n2, and a refractive index of the third inorganic encapsulating sub-layer is n3, and a refractive index of the fourth inorganic encapsulating sub-layer is n4, wherein $n2<n3<n1$, $n4<n3$, and $n1-n2>0.4$; and wherein a thickness of the fourth inorganic encapsulating sub-layer is less than the thickness of the third inorganic encapsulating sub-layer.

2. The display panel according to claim 1, wherein n1>1.9.

3. The display panel according to claim 2, wherein n3>1.7.

4. The display panel according to claim 3, wherein n2<1.5.

5. The display panel according to claim 1, wherein the light-emitting device comprises a first electrode, a second electrode, and a light-emitting layer disposed between the first electrode and the second electrode, and the second electrode is disposed on one side of the light-emitting layer close to the encapsulating member; and the display panel further comprises an organic light-gathering layer disposed between the first inorganic encapsulating sub-layer and the second electrode.

6. The display panel according to claim 1, wherein a side surface of the first inorganic encapsulating sub-layer close to the light-emitting device is in contact with a side surface of the light-emitting device close to the encapsulating member.

7. The display panel according to claim 1, wherein a material of the first inorganic encapsulating sub-layer comprises silicon nitride and materials of the second inorganic encapsulating sub-layer and the third inorganic encapsulating sub-layer comprise silicon oxynitride.

8. The display panel according to claim 1, wherein the fourth inorganic encapsulating sub-layer is disposed on one side of the third inorganic encapsulating sub-layer away from the light-emitting device.

9. The display panel according to claim 1, wherein the organic encapsulating layer is disposed on one side of the first inorganic encapsulating layer away from the light-emitting device and the second inorganic encapsulating layer is disposed on one side of the organic encapsulating layer away from the light-emitting device.

10. The display panel according to claim 2, wherein the light-emitting device comprises a first electrode, a second electrode, and a light-emitting layer disposed between the first electrode and the second electrode, and the second electrode is disposed on one side of the light-emitting layer close to the encapsulating member; and the display panel further comprises an organic light-gathering layer disposed between the first inorganic encapsulating sub-layer and the second electrode.

11. The display panel according to claim 2, wherein a side surface of the first inorganic encapsulating sub-layer close to the light-emitting device is in contact with a side surface of the light-emitting device close to the encapsulating member.

12. A display device comprising a display panel, wherein the display panel comprises:

a light-emitting device; and an encapsulating member disposed on the light-emitting device for encapsulating the light-emitting device, the encapsulating member comprises a first inorganic encapsulating layer, a second inorganic encapsulating layer, and an organic encapsulating layer stacked sequentially, the first inorganic encapsulating layer comprises at least a first inorganic encapsulating sub-layer, a second inorganic encapsulating sub-layer, a third inorganic encapsulating sub-layer, and a fourth inorganic encapsulating sub-layer that are sequentially stacked in a direction away from the light-emitting device;

wherein a thickness of the third inorganic encapsulating sub-layer is greater than a thickness of the first inorganic encapsulating sub-layer and a thickness of the second inorganic encapsulating sub-layer; a refractive index of the first inorganic encapsulating sub-layer is n1, a refractive index of the second inorganic encapsulating sub-layer is n2, and a refractive index of the third inorganic encapsulating sub-layer is n3, and a refractive index of the fourth inorganic encapsulating sub-layer is n4, wherein n2<n3<n1, n4<n3, and n1-n2>0.4; and wherein a thickness of the fourth inorganic encapsulating sub-layer is less than the thickness of the third inorganic encapsulating sub-layer.

13. The display device according to claim 12, wherein n1>1.9.

14. The display device according to claim 13, wherein n3>1.7.

15. The display device according to claim 14, wherein n2<1.5.

16. The display device according to claim 12, wherein the light-emitting device comprises a first electrode, a second electrode, and a light-emitting layer disposed between the first electrode and the second electrode, and the second electrode is disposed on one side of the light-emitting layer close to the encapsulating member; and the display panel further comprises an organic light-gathering layer disposed between the first inorganic encapsulating sub-layer and the second electrode.

17. The display device according to claim 12, wherein a side surface of the first inorganic encapsulating sub-layer close to the light-emitting device is in contact with a side surface of the light-emitting device close to the encapsulating member.

18. The display device according to claim 12, wherein a material of the first inorganic encapsulating sub-layer comprises silicon nitride and materials of the second inorganic encapsulating sub-layer and the third inorganic encapsulating sub-layer comprise silicon oxynitride.

19. The display device according to claim 12, wherein the fourth inorganic encapsulating sub-layer is disposed on one side of the third inorganic encapsulating sub-layer away from the light-emitting device.

20. The display device according to claim 12, wherein the organic encapsulating layer is disposed on one side of the first inorganic encapsulating layer away from the light-emitting device and the second inorganic encapsulating layer is disposed on one side of the organic encapsulating layer away from the light-emitting device.

* * * * *